United States Patent
Yeap et al.

(10) Patent No.: US 6,753,242 B2
(45) Date of Patent: Jun. 22, 2004

(54) INTEGRATED CIRCUIT DEVICE AND METHOD THEREFOR

(75) Inventors: Geoffrey C-F Yeap, Austin, TX (US); Srinivas Jallepalli, Austin, TX (US); Yongjoo Jeon, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/101,298

(22) Filed: Mar. 19, 2002

(65) Prior Publication Data

US 2003/0181028 A1 Sep. 25, 2003

(51) Int. Cl.$^7$ ................................................ H01L 21/31
(52) U.S. Cl. ...................................... 438/595; 438/696
(58) Field of Search ............................. 438/230, 595, 438/696, 778–794

(56) References Cited

U.S. PATENT DOCUMENTS

| | | | |
|---|---|---|---|
| 5,902,125 A | | 5/1999 | Wu |
| 5,960,270 A | * | 9/1999 | Misra et al. ............... 438/197 |
| 5,972,762 A | | 10/1999 | Wu |
| 6,066,567 A | | 5/2000 | En |
| 6,087,271 A | | 7/2000 | En |
| 6,156,126 A | | 12/2000 | Chen et al. |
| 6,245,682 B1 | | 6/2001 | Fu |
| 6,368,947 B1 | * | 4/2002 | Yu ............................. 438/530 |
| 6,372,589 B1 | * | 4/2002 | Yu ............................. 438/304 |

FOREIGN PATENT DOCUMENTS

WO    WO01/50504 A2    7/2001

OTHER PUBLICATIONS

PCT International Search Report.

* cited by examiner

*Primary Examiner*—Long Pham
*Assistant Examiner*—Marcos D. Pizarro-Crespo
(74) *Attorney, Agent, or Firm*—James L. Clingan, Jr.; Kim-Marie Vo

(57) ABSTRACT

A semiconductor device has recesses formed in the substrate during removal of the anti-reflective coating (ARC) because these recess locations are exposed during the etching of the ARC. Although the etchant is chosen to be selective between the ARC material and the substrate material, this selectivity is limited so that recesses do occur. A problem associated with the formation of these recesses is that the source/drains have further to diffuse to become overlapped with the gate. The result is that the transistors may have reduced current drive. The problem is avoided by waiting to perform the ARC removal until at least after formation of a sidewall spacer around the gate. The consequent recess formation thus occurs further from the gate, which results in reducing or eliminating the impediment this recess can cause to the source/drain diffusion that desirably extends to overlap with the gate.

25 Claims, 10 Drawing Sheets

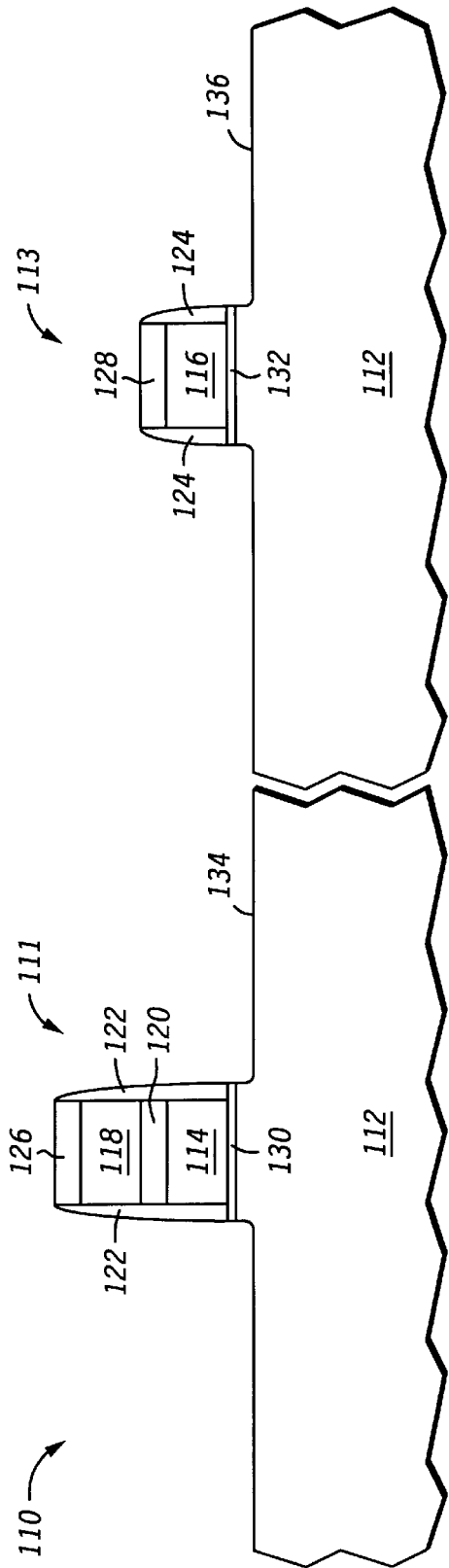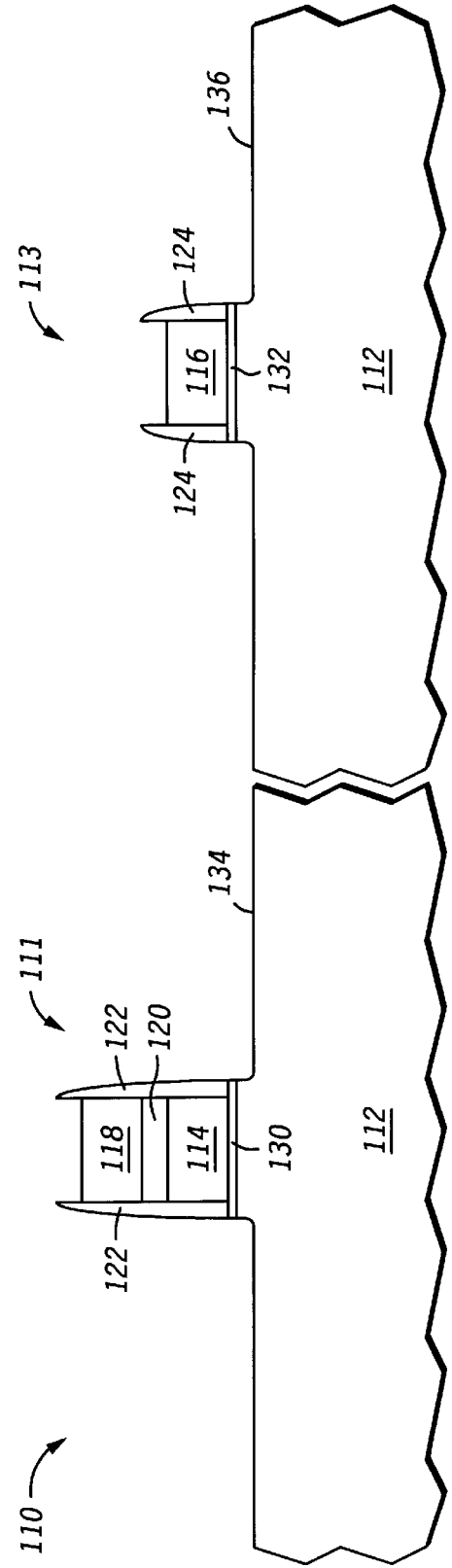

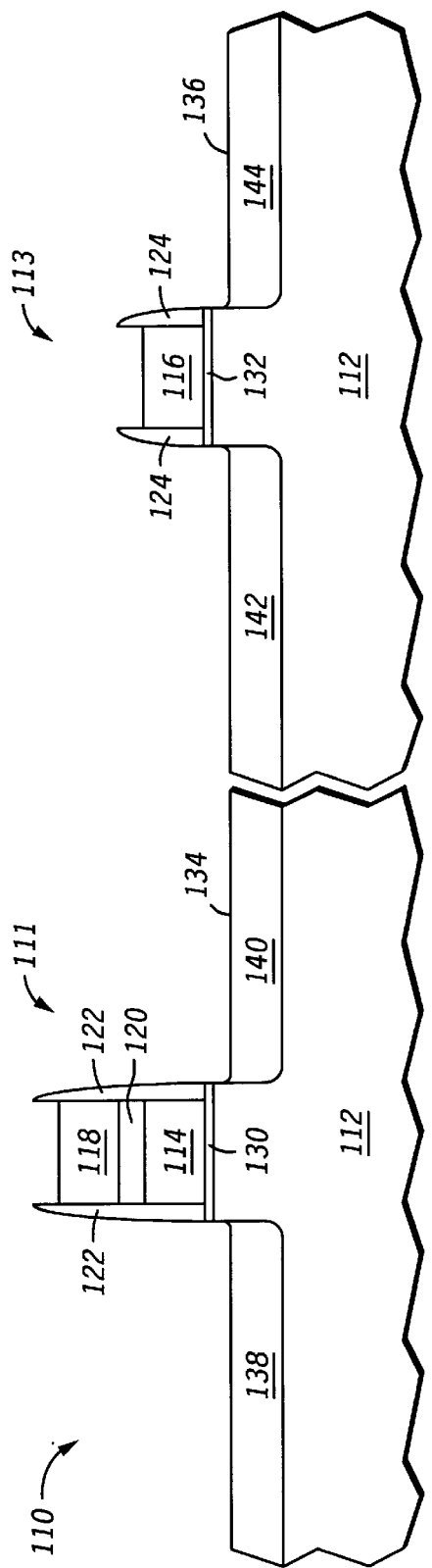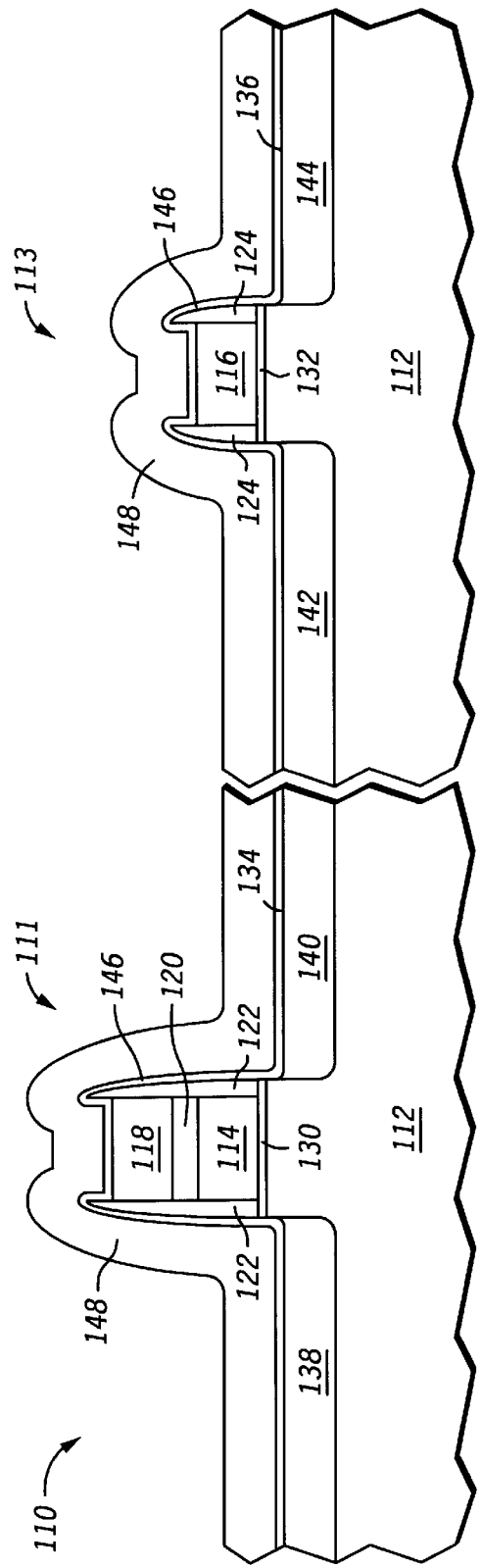

US 6,753,242 B2

INTEGRATED CIRCUIT DEVICE AND METHOD THEREFOR

FIELD OF THE INVENTION

This invention relates to integrated circuits and more particularly to integrated circuits with a recess in the substrate.

RELATED ART

In the manufacture of integrated circuits one of the problems that has become more significant as dimensions have become smaller is recesses in the substrate that occur under normal processing. The recesses in the substrate occur primarily as a consequence of the substrate being exposed during the etching away of some portion of a layer of material that was over the substrate. An etchant is applied to the substrate for some amount of time during and/or after the layer that is being etched has been removed. One example is that there is a situation in which there is exposed substrate at the onset of an etch of another material in a different location. Another example is that a thin layer over the substrate is etched through during an etch of a material elsewhere so that the substrate becomes exposed part way through the etch of the material elsewhere. Another example is that a layer over the substrate is being etched and after the substrate becomes exposed, the etch continues as an over-etch to ensure that the layer that is desired to be removed is completely removed. The etchant that is chosen desirably does not significantly etch semiconductor substrates, but as a practical matter such etchants are very difficult to work with. Consequently the layers that are desired to be removed are removed by an etchant that does have some etching effect on the semiconductor substrate, typically silicon. Such a process is shown in FIGS. 1–9.

Shown in FIG. 1 is a semiconductor device 10 useful in making an integrated circuit comprising a substrate 12, a polysilicon gate 14, an anti-reflective coating (ARC) 16 of nitride, and a thin oxide 18 which is between gate 14 and substrate 12 as well as extending in areas adjacent to gate 14. In order to remove nitride ARC 16, an etchant, such as a halogen based material such as fluorine and chlorine, is used. These etchants also etch silicon although at not as fast a rate as nitride is etched. The result of removing ARC 16 is a recess surface 22 shown in FIG. 2. Shown in FIG. 3 is device 10 after formation of a sidewall spacer 24. Sidewall spacer 24 is formed of oxide and occurs as a result, as is commonly known, of applying a relatively conformal layer and subsequently etching it with an anisotropic etch. This causes a further recess in substrate 12 aligned with sidewall spacer 24. Shown in FIG. 4 is formation of source/drain region 26 and source/drain 28 using sidewall spacer 24 as a mask. This implant is commonly called the extension implant and has a relatively lower doping concentration than a subsequent heavy source/drain implant.

Shown in FIG. 5 is device 10 after deposition of an oxide liner 30 and a nitride layer 32. Nitride layer 32 is then etched back as is liner 30 resulting in sidewall spacer 34 and liner portion 38. During this processing, source/drain regions 26 and 28 diffuse, expanding the area of source/drain regions 26 and 28. Shown in FIG. 7 is device 10 after a heavy implant to form heavily-doped regions 40 and 42 using sidewall spacer 34 as a mask. Shown in FIG. 8 is continued expansion of source/drain regions 26 and 28 as well as diffusion of regions 40 and 42 due to standard processing.

Shown in FIG. 9 is device 10 after formation of silicide regions 48 and 50 which extend under regions 40 and 42. This also shows a completed diffusion of regions 49 and 51, which are the remaining portions of regions 26 and 28. These regions may not extend all the way to gate oxide 20. With the regions 49 and 51 not fully extending to be in contact with gate oxide 20, there is some additional space between gate 44 and the channel formed between regions 49 and 51 so that current passing between regions 49 and 51 is less than it would be if they had diffused in closer proximity to gate 20. This is a disadvantage and is a direct result of the additional distance the diffusion must travel due to the recess of substrate 12 adjacent to gate 44. Silicide region 46 is also formed on top of gate 14 and consumes a significant amount of gate 14 to leave a gate that is a combination of a region 44 of polysilicon and a region 46 of silicide.

Thus, there is a need to reduce the adverse effects of a recess that occurs in the substrate during normal processing. This problem continues to get worse as dimensions decrease and voltages decrease. The ability to completely invert the channel and provide optimum current between source and drain is compromised if the source and drain do not have the proper overlap with the overlying gate.

BRIEF DESCRIPTION OF THE DRAWINGS

FIGS. 1–18 are sequential cross-sections of a semiconductor device made according to one embodiment of the invention; and FIGS. 19–25 are sequential cross-sections of a semiconductor device made according to another embodiment of the invention.

DESCRIPTION OF THE INVENTION

A problem with recess in the substrate is overcome by waiting until later in the process to remove the nitride anti-reflective coating (ARC) so that the recess that occurs has much less impact with regard to the source and drain moving in to close proximity to the gate dielectric and overlapping with the gate. One way this is achieved is by waiting until the sidewall spacer stack that is utilized for masking the heavy source/drain implant is in place before removing the nitride ARC. In an alternative, the nitride ARC is removed after formation of the sidewall spacer that is used for the source/drain extension implant and in such case the nitride ARC is removed with a wet etch.

Figure 1:
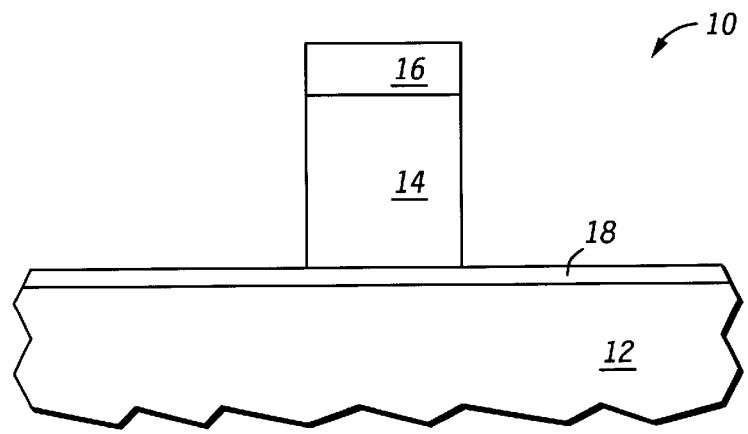
FIGS. 1–9 show sequential cross-sections of a semiconductor device according to the prior art.
Figure 2:
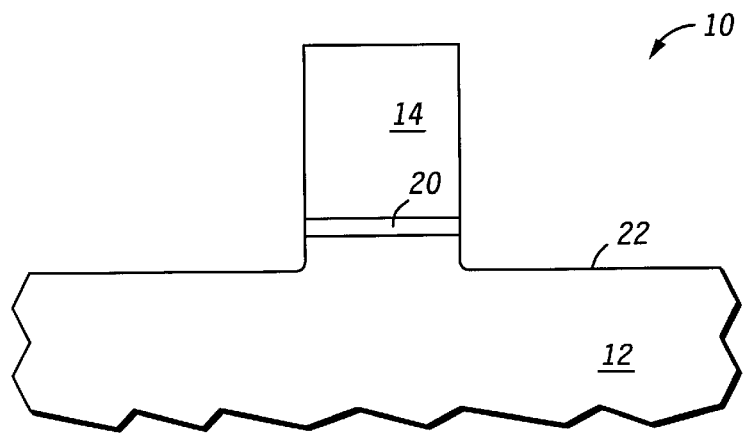
Figure 3:
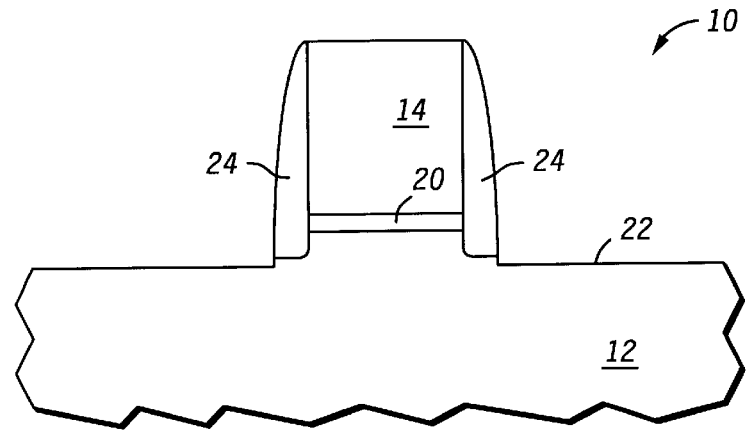
Figure 4:
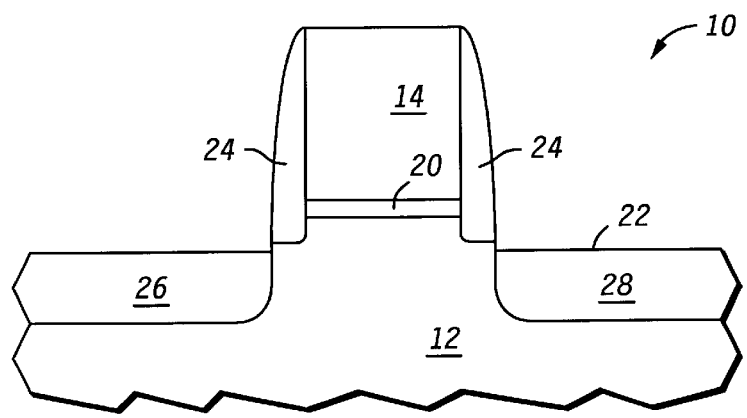
Figure 5:
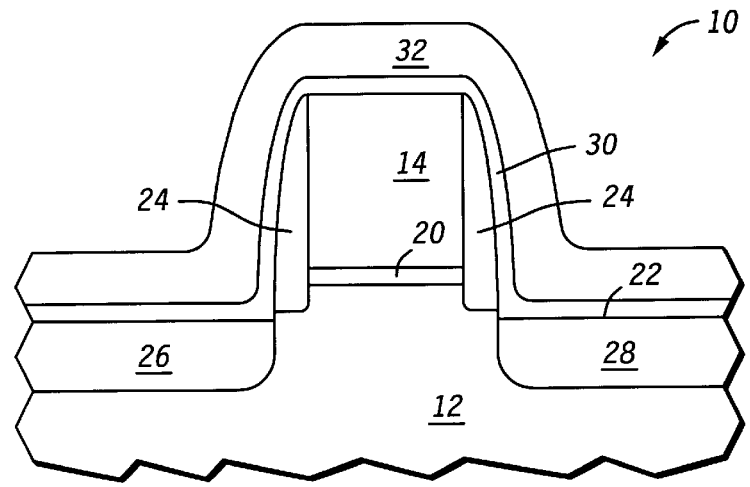
Figure 6:
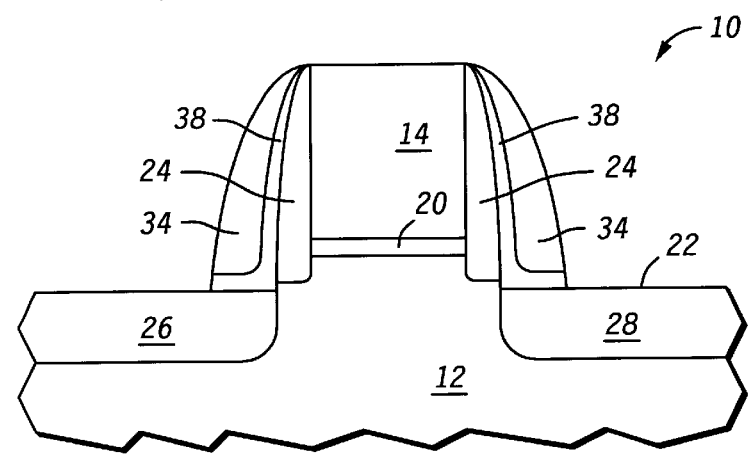
Figure 7:
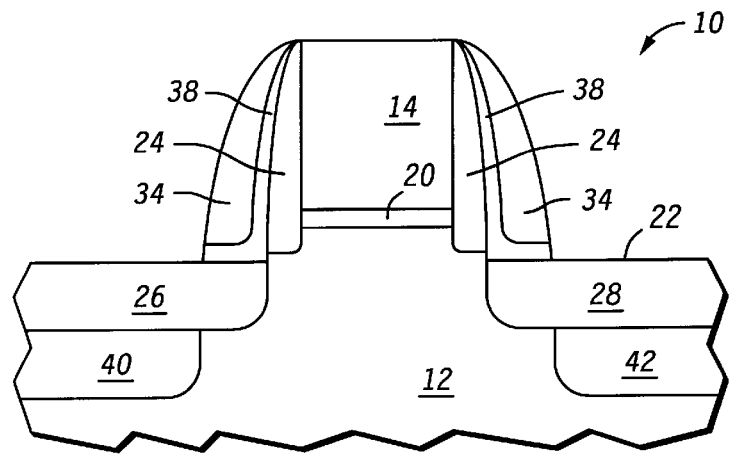
Figure 8:
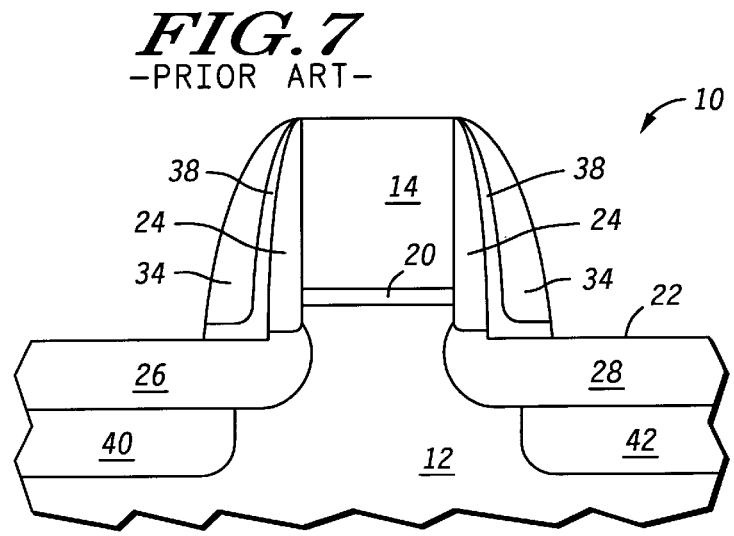
Figure 9:
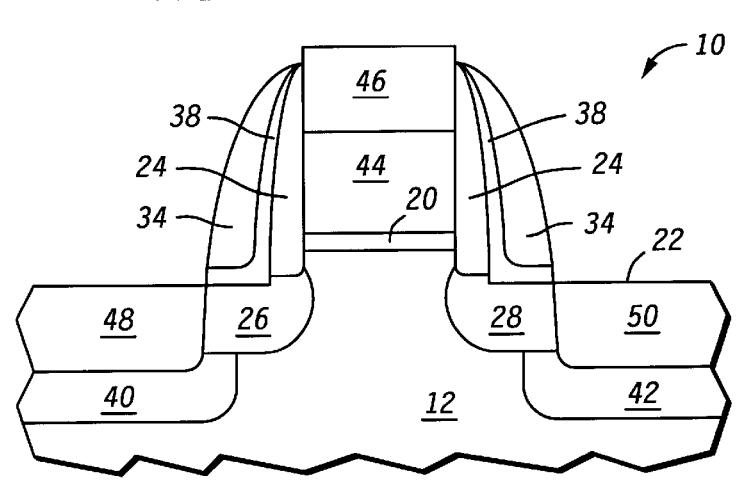
Figure 10:
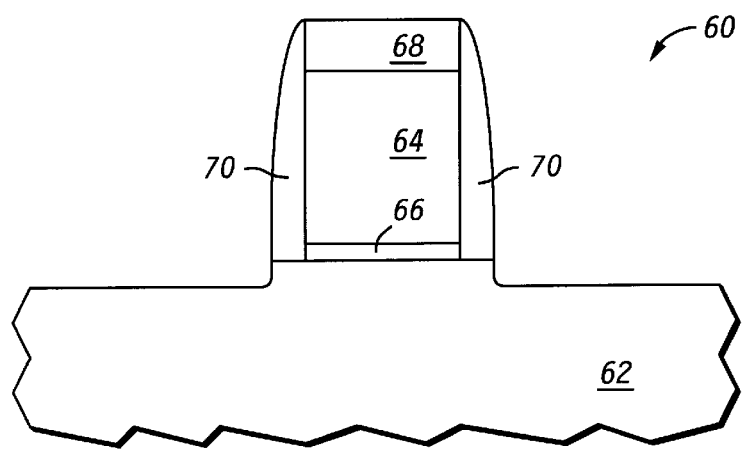
Figure 11:
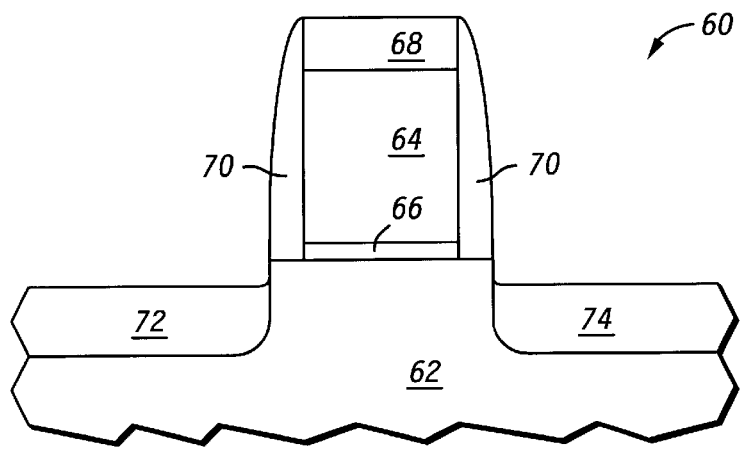

Shown in FIG. 10 is a device 60 after formation of a sidewall spacer 70 as an alternative to the structure shown in FIG. 2. The structure of FIG. 10 follows the device structure shown in FIG. 1. Device 60 comprises a substrate 62, a gate 64, which may be made of polysilicon and is a type of patterned conductive layer, a gate oxide 66, an ARC 68, which may be nitride, and a sidewall spacer 70. Preferable material for substrate 62 is silicon and for sidewall spacer 70 is oxide. ARC 68 could be of some other effective anti-reflective material than nitride as well. Gate 64 could be materials other than polysilicon also. Sidewall spacer 70 results from an oxide layer that is relatively conformal being anisotropically etched. As a consequence of this anisotropic etch will be a recess 71 of substrate 62. This is a consequence of the necessary over-etch to ensure that all of the layer that is being used to form the sidewall spacer is removed except where the sidewall spacer is to be formed. Since the only exposure of the substrate is during an over-etch time, the recess is relatively small. Shown in FIG. 11 is device 60 after a source/drain extension implant forming source/drain region 72 and source/drain region 74 adjacent to sidewall spacer 70 which surrounds gate 64.

Figure 12:
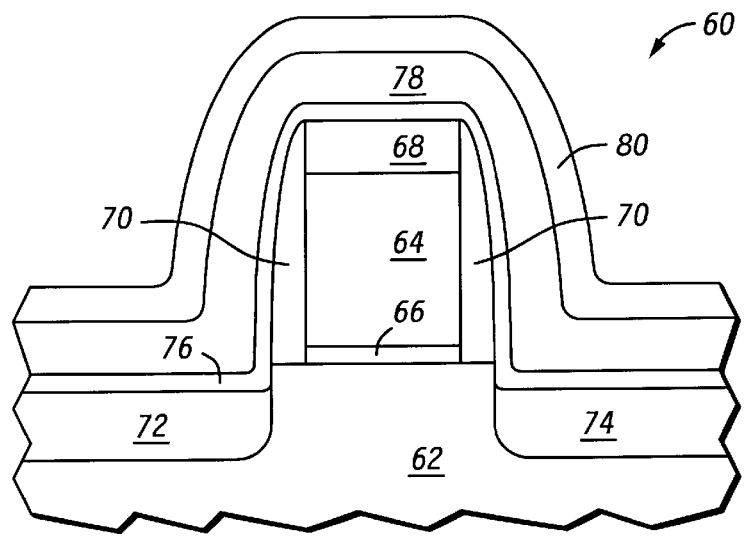
Figure 13:
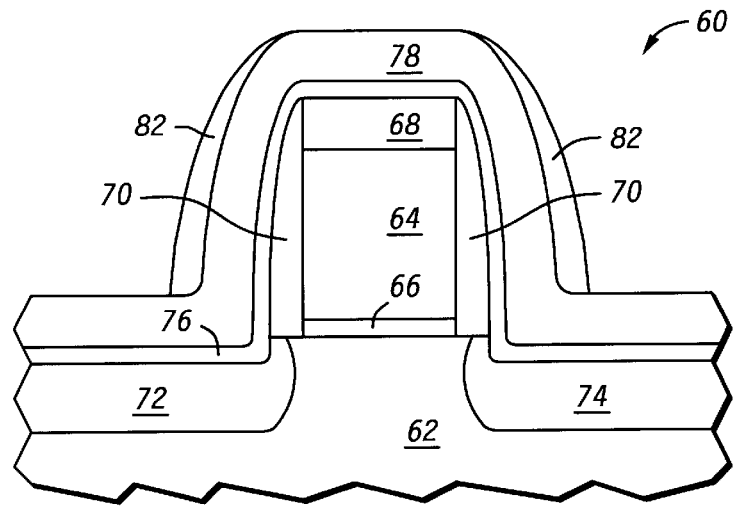
Figure 14:
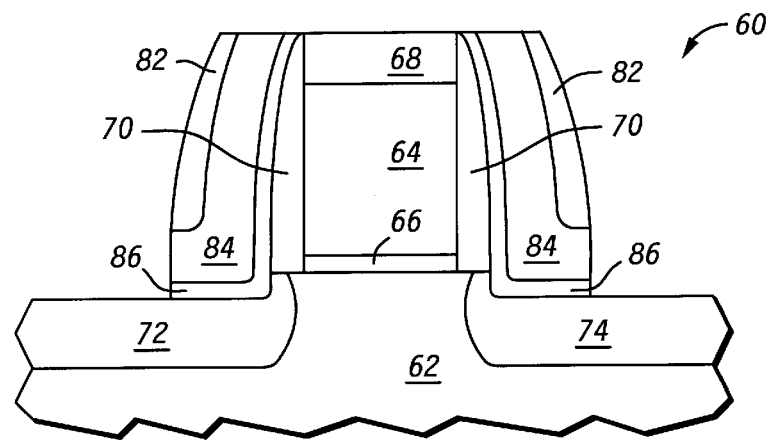
Figure 15:
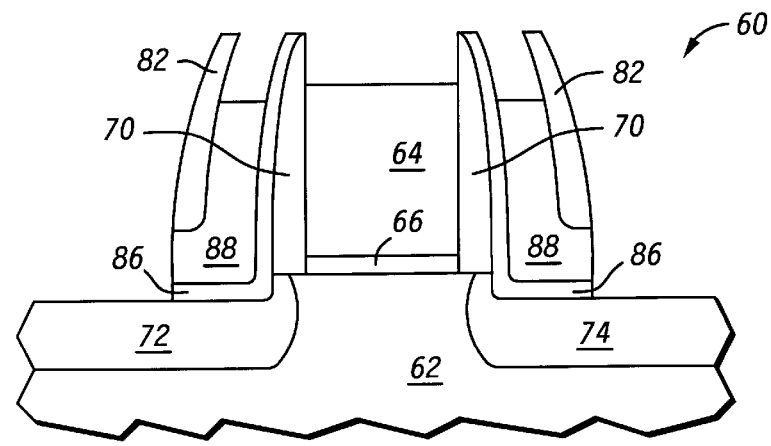

Shown in FIG. 12 is device 60 after formation of liner 76, a layer 78, and a layer 80. Layer 76, 78 and 80 are all typically dielectric materials. Layer 76 is preferably oxide, layer 78 is preferably nitride, and layer 80 is preferably oxide, but instead of a typical dielectric may be amorphous silicon. Shown in FIG. 13 is sidewall spacer 82 formed from layer 80 using an anisotropic etch. This exposes layer 78 of nitride in areas adjacent to sidewall spacer 82 including an area over gate 64 and ARC 68 as well as a portion of layer 76 which functions as a liner. Shown in FIG. 14 is device 60 after a nitride etch has been performed so that uncovered portions of layer 78 are removed to leave nitride portions 84 around gate 64. This also has the effect of removing the portion of layer 76 above ARC 68 to leave a portion 86 of layer 76. During this processing regions 72 and 74 diffuse toward each other and toward being under gate 64. With the relatively small amount of recess of substrate 62, the diffusion process is effective in overcoming that small amount of recess. The removal of nitride continues until ARC 68 has been removed which also causes a reduction in the height of sidewall spacer 84 to leave sidewall spacer 88. Sidewall spacer 88 is slightly lower than polysilicon 64 due to over-etching which is necessary to be certain that all of ARC 68 has been removed. A relatively large recess in substrate 62 aligned with sidewall spacer 82 occurs primarily during the etch of ARC 68. This etch is preferably a dry etch because of its superior defectivity characteristics over that of a wet etch. The dry etch will result in a greater recess in substrate 62 than if a wet etch had been used. In this case, however, the relative difference is not material because the recess is significantly removed from the area where it would have a negative impact on the ability of source/drain regions 72 and 74 to become overlapped with gate 64.

Figure 16:
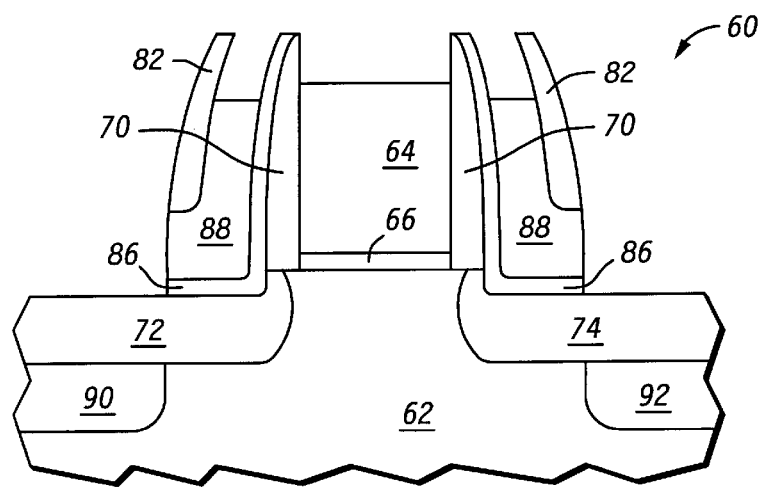
Figure 17:
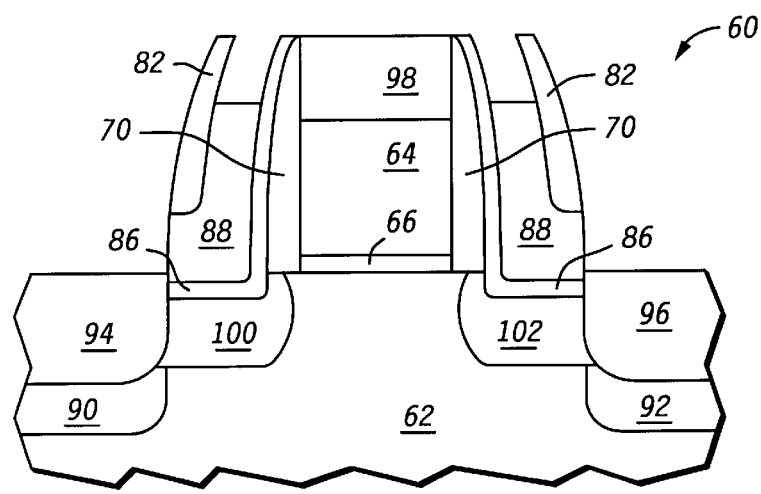
Figure 18:
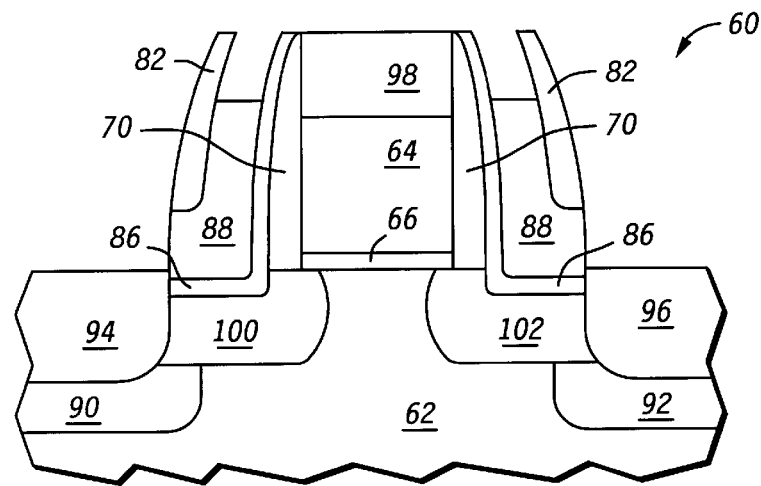
Figure 23:
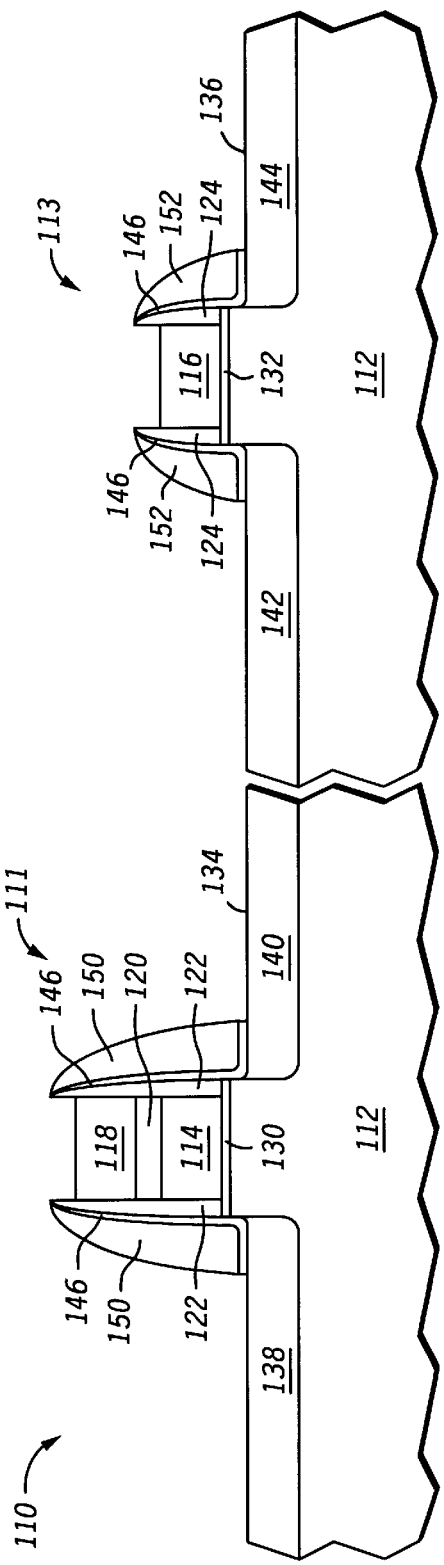

Shown in FIG. 16 is device 60 after a heavy source/drain implant resulting in heavily doped source/drain regions 90 and 92 aligned to sidewall spacer 82 which acts as an implant mask. If sidewall spacer 82 is chosen to be amorphous silicon, it should be removed after this implant. Shown in FIG. 17 is device structure 60 after a silicide step forms silicide regions 94 and 96 that are also aligned to sidewall spacer 82. If sidewall spacer 82 was chosen to be amorphous silicon, it should be removed before this step of forming silicide. In the depicted example, sidewall spacer 82 is oxide. Shown in FIG. 18 are portions 100 and 102 of source/drain regions 72 and 74, respectively, that have diffused sufficiently to overlap gate 64. The relatively small recess caused during the over-etch in the formation of sidewall spacer 70 is all that needs to be overcome so that source/drain regions 100 and 102 overlap gate 64. The recess caused by the etching away of ARC 16 is not visible in the final device structure shown in FIG. 18. The formation of silicide in the area of the recession removes the evidence that there was even a recess present. Thus it is seen that by moving the location of the relatively large recessed area caused as a result of the removal of the ARC layer by a dry etch further away from the gate area, this relatively large recessed area does not impact the distance that the source/drain must diffuse to obtain the desired overlap.

Shown in FIG. 19 is a device structure 110 is shown as a beginning point for another embodiment comprised of a non-volatile memory (NVM) transistor 111 and a regular transistor 113 both of which are formed in a substrate 112. Transistor 111, as shown in FIG. 19, comprises a gate oxide 130, a floating gate 114, an interlayer dielectric 120, and a control gate 118. Regular transistor 113 comprises a gate oxide 132 and a gate 116. Over control gate 118 is an ARC layer 126 and over gate 116 is an ARC layer 128. These are two transistors are formed simultaneously and are shown as transistors that would occur as a result of formation of sidewall spacers 122 and 124 and analogous to FIG. 10. Thus there is a recess in the surface of substrate 112 shown as 134 and 136 in FIG. 19. This recess is caused by the over-etch in the formation of sidewall spacer 122. Shown in FIG. 20 is device structure 110 after ARC layers 126 and 128 have been removed using a wet etch. By using a wet etch the recess shown in 134 and 136 in FIG. 120 is significantly less than it would be if a dry etch were used. A typical wet etch chemistry is phosphoric acid. A typical dry etch for nitride is CF4+HBO. The wet etch is effective in this situation because sidewall spacer 122 protects interlayer dielectric 120. A wet etch without sidewall spacer 122 protecting interlayer dielectric 120 would degrade dielectric layer 120 and cause a problem between the storage element 114 and the control gate 118. It is important that there not be leakage between storage element 114, which in this depicted case is a floating gate, and control gate 118. With the protection of sidewall spacer 122, the wet etch will not harm interlayer dielectric 120. This also shows the resulting transistor 113 with ARC 128 removed.

Figure 24:
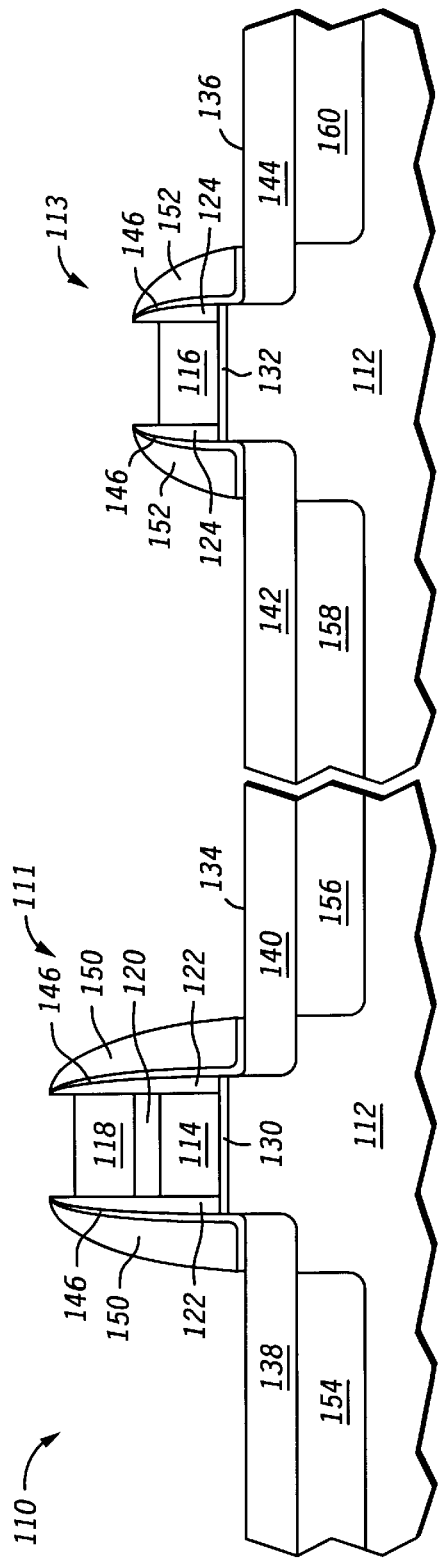

Shown in FIG. 21 is device structure 110 after an extension implant using sidewall spacer 122 as a mask and sidewall spacer 124 as a mask. The resulting source/drain extension regions 138, 140, 142, and 144 are formed. Shown in FIG. 22 is device structure 110 after deposition of a liner 146 and a nitride layer 148. Nitride layer 148 is then anisotropically etched to form sidewall spacer 150 and sidewall spacer 152. Liner 146 is substantially, if not completely, removed in those areas where it is exposed as a consequence of the removal of nitride layer 148 in the forming of sidewall spacers 150 and 152. Shown in FIG. 24 is device structure 110 after a heavy implant to form heavily doped source/drain regions 154, 156, 158, and 160 using sidewall spacers 150 and 152 as a mask.

Figure 25:
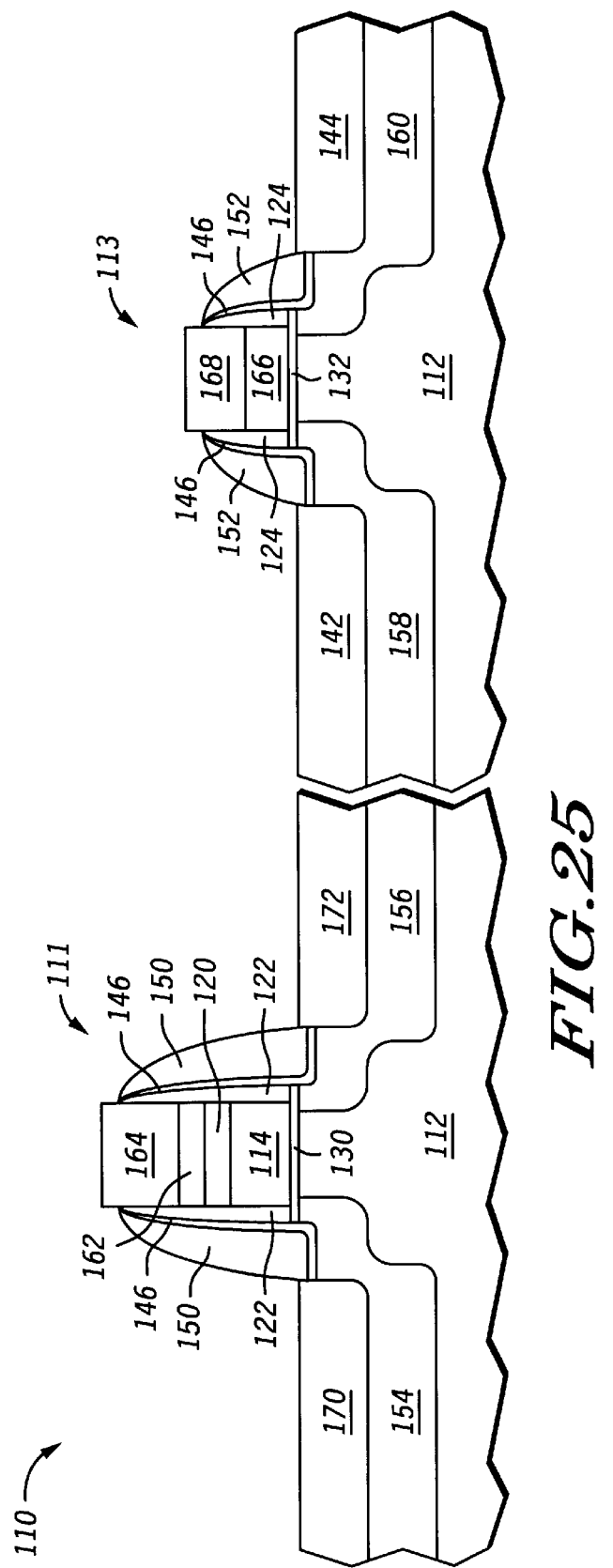

Shown in FIG. 25 is device structure 110 after suicide formation to form silicide regions 170, 172, 174, and 176. Thus the source/drain regions 142 and 144 have, to a large extent, been consumed by silicide regions 170, 172, 174, and 176. Similarly, gate regions 114 and 116 have been somewhat consumed by silicide regions 164 and 168 respectively. This leaves a polysilicon portion 167 for transistor 111 and a polysilicon portion 166 for transistor 113. Source/drain portions 178, 180, 182, and 184 expand and diffuse sufficiently to overlap gate regions 167 and 166 although there is a recess to overcome caused by removal of the ARC. Such ARC removal is by wet etch so that the amount of the recess is significantly less then that of a dry etch. Although the dry etch is preferred, in the case of a non-volatile memory the significance of having sufficient overlap is greater than for a regular transistor. Thus it is more important that the overlap between the floating gate, the area that has charge storage in it, to have good overlap in the source/drain area. Also, by having the ARC removed after formation of sidewall spacer 122, the location of the recess does not have as severe of an impact as for the case depicted in FIGS. 1–9 in which the ARC removal occurs prior to formation of such sidewall spacer. In the case of FIGS. 1–9, the sidewall spacer 24 is formed after removal of the ARC layer.

What is claimed is:

1. A method of forming an integrated circuit device comprising:

providing a semiconductor substrate;

forming a first patterned layer over the semiconductor substrate, wherein the first patterned layer has a first top, a first sidewall and a second sidewall and the first sidewall and the second sidewall are approximately vertical and opposite each other;

forming a second patterned layer over the patterned dielectric layer, wherein the second patterned layer has a second top, a third sidewall and a fourth sidewall, the third sidewall and the fourth sidewall are approximately vertical, opposite each other, and approximately co-planar with the first sidewall and the second sidewall, respectively;

forming an anti-reflective coating (ARC) over the second patterned layer;

forming a first dielectric layer over the first top and the second top and adjacent to the first sidewall, the second sidewall, the third sidewall, and the fourth sidewall;

removing a portion of the first dielectric layer, to form a first dielectric region adjacent the first sidewall and the third sidewall and a second dielectric region adjacent the third sidewall and the fourth sidewall, wherein the portion includes regions of the first dielectric layer formed over the first top and the second top;

removing the ARC after removing the portion of the first dielectric layer; and forming a channel region within the semiconductor substrate under the first patterned layer and second patterned layer.

2. The method of claim 1, further comprising oxidizing the first and second dielectric regions before removing the portion of the ARC, wherein removing the ARC is a wet process.

3. The method of claim 1, wherein the second patterned layer is a charge storage layer of a non-volatile memory device.

4. The method of claim 1, wherein the first dielectric region and the second dielectric region comprise a stack of a first oxide layer and a first nitride layer formed over the first oxide layer.

5. The method of claim 4, further comprising a second oxide layer.

6. The method of claim 1, wherein the first patterned layer is a gate dielectric and the second patterned layer is a gate electrode.

7. The method of claim 6, further comprising forming shallow doped regions within the semiconductor substrate before removing the ARC.

8. The method of claim 6, wherein removing the ARC is a wet process.

9. The method of claim 6, wherein removing the ARC is a dry process.

10. The method of claim 6, further comprising:

forming a second dielectric layer over the first dielectric region and the second dielectric region;

forming a third dielectric layer over the second dielectric layer; and anisotropically etching the third dielectric layer and the second dielectric layer to form first and second portions of spacers adjacent the first patterned layer and second patterned layer.

11. The method of claim 10, wherein the second dielectric layer is an oxide and the third dielectric layer is a nitride.

12. The method of claim 10, further comprising:

forming a fourth layer over the third dielectric layer; and anisotropically etching the fourth layer selective to the third dielectric layer.

13. The method of claim 12, wherein anisotropically etching the fourth layer forms a third portion of the spacers.

14. The method of claim 13, wherein the fourth layer is an oxide.

15. The method of claim 12, further comprising:

forming a silicide region over the first patterned layer;

removing the fourth layer after anisotropically etching the fourth layer and before forming the silicide.

16. The method of claim 15, wherein the fourth layer is amorphous silicon.

17. A method of forming an integrated circuit device comprising:

providing a semiconductor substrate;

forming a patterned dielectric layer over the semiconductor substrate, forming a patterned conductive layer over the patterned dielectric layer;

forming an anti-reflective coating (ARC) over the patterned conductive layer;

forming a first dielectric layer over the patterned dielectric layer and the patterned conductive layer;

forming a second dielectric layer over the first dielectric layer;

forming a first layer over the second dielectric layer;

removing portions of the first layer to form a first patterned layer, wherein the first patterned layer is adjacent the patterned conductive layer and the patterned dielectric layer;

removing portions of the second dielectric to form first dielectric regions adjacent the first patterned layer;

removing portions of the first dielectric to form second dielectric regions adjacent the first dielectric regions; and removing the ARC after removing the portions of the first dielectric layer.

18. The method of claim 17, wherein the first dielectric layer is an oxide, the second dielectric layer is a nitride and the first layer is an oxide.

19. The method of claim 18, wherein removing the ARC is a wet process.

20. The method of claim 17, further comprising:

forming a second layer over the first layer;

removing a portion of the second layer selective to the first layer to form patterned first portions of the second layer adjacent to the first patterned layer.

21. The method of claim 20, wherein removing the ARC is a dry process.

22. The method of claim 20, wherein the second layer is an oxide, the first layer is a nitride, the second dielectric layer is an oxide, and the first dielectric layer is an oxide.

23. The method of claim 22, further comprising removing the portions of the second layer, wherein the second layer is amorphous silicon.

24. A method of forming an integrated circuit device comprising:

providing a semiconductor substrate;

providing a stack comprising a gate dielectric layer over the semiconductor substrate, a gate over the gate dielectric, and an anti-reflective coating (arc) over the gate;

forming a first sidewall spacer around the gate and the arc;

implanting into the substrate using the first sidewall spacer and the stack as a mask to form a first doped region and a second doped region;

forming a liner over the stack, aroung the stack, and over the firsdt doped region and the second doped region;

depositing a first layer of a first composition over the liner;

forming a second sidewall spacer around the first layer;

removing portions of first layer over the arc and over portions of the first and second doped regions using the second sidewall spacer as a mask;

removing the liner over the arc and the portions of the first and second doped regions; and applying an etchant to simultaneously remove the arc and a portion of the first layer between the second sidewall spacer and the liner.

25. The method of claim 24, wherein the ARC and the first layer comprise nitride.

* * * * *

UNITED STATES PATENT AND TRADEMARK OFFICE
CERTIFICATE OF CORRECTION

PATENT NO.       : 6,753,242 B2
APPLICATION NO.  : 10/101298
DATED            : June 22, 2004
INVENTOR(S)      : Yeap et al.

It is certified that error appears in the above-identified patent and that said Letters Patent is hereby corrected as shown below:

In Column 7, Line 2, change "firsdt" to -- first --

Signed and Sealed this

Twenty-fifth Day of July, 2006

JON W. DUDAS
*Director of the United States Patent and Trademark Office*